United States Patent [19]

Ieki et al.

[11] 4,297,660
[45] Oct. 27, 1981

[54] ELECTRIC CIRCUIT USING SURFACE ACOUSTIC WAVE DEVICE

[75] Inventors: Hideharu Ieki, Nagaokakyo; Seiichi Arai, Muko, both of Japan

[73] Assignee: Murata Manufacturing Co., Ltd., Japan

[21] Appl. No.: 101,279

[22] Filed: Dec. 7, 1979

[30] Foreign Application Priority Data

Dec. 14, 1978 [JP] Japan ........................ 53-173215[U]
Dec. 26, 1978 [JP] Japan ........................ 53-182526[U]

[51] Int. Cl.³ .................... H03H 9/64; H03H 9/42
[52] U.S. Cl. .................... 333/194; 333/151; 358/905
[58] Field of Search ............ 333/32, 150, 151, 152, 333/153, 154, 155, 193-196; 310/313-314, 316-319; 358/21 R, 35-38, 904-905; 331/107 A; 330/5.5, 53, 250, 306

[56] References Cited

PUBLICATIONS

Smith et al.-"Analysis of Interdigital Surface Wave Transducers by Use of an Equivalent Circuit Model", IEEE Transactions on Microwave Theory and Techniques, vol. MTT-17, No. 11, Nov. 1969, pp. 856-864.
Rogers-"The Theory of Networks in Electrical Communication and Other Fields", MacDonald, London, 1957, pp. 405-408 and Title Page.
Johnson-"Multiband L Matching Network" in QST, Dec. 1955, pp. 45-47.

Primary Examiner—Marvin L. Nussbaum
Attorney, Agent, or Firm—Ostrolenk, Faber, Gerb & Soffen

[57] ABSTRACT

A surface acoustic wave device comprises an input and output transducers. A signal is supplied from a signal input circuit to the input transducer and a surface wave corresponding to the input signal is propagated from the input transducer to the output transducer, from which an electrical signal corresponding to the surface wave is withdrawn and is applied to a signal output circuit. An impedance converting circuit is inserted in series between the signal input circuit and the input transducer and/or between the output transducer and the signal output circuit. It has been discovered that this arrangement reduces the electrical triple transit echo.

7 Claims, 11 Drawing Figures

ELECTRIC CIRCUIT USING SURFACE ACOUSTIC WAVE DEVICE

BACKGROUND OF THE INVENTION

1. Field of the Invention

The present invention relates to an electric circuit using a surface acoustic wave device. More specifically, the present invention relates to an electric circuit such as a video intermediate frequency signal amplifying circuit of a television receiver using a surface acoustic wave filter.

2. Description of the Prior Art

FIG. 1 is a view showing one example of a conventional surface acoustic wave device. As well known, the surface acoustic wave device SAW comprises a substrate 1 made of a piezoelectric material such as piezeoelectric ceramic, and an input transducer 2 and an output transducer 3 formed thereon each including an electrode arrangement of such as an interdigital pattern. The input transducer 2 comprises paired comb-shaped electrodes, so that the electrode fingers 2a and 2b of the respective comb-shaped electrodes are adjacent to each other. Similarly, the output transducer 3 also comprises paired comb-shaped electrodes, so that the electrode fingers 3a and 3b are adjacent to each other. One comb-shaped electrode of the input transducer 2 is connected to the input terminal 4 and the other comb-shaped electrode is connected to the input terminal 4'. Similarly, one comb-shaped electrode of the output transducer 3 is connected to the output terminal 5 and the other comb-shaped electrode is connected to the output terminal 5'.

Such a surface acoustic wave device as a surface wave filter is employed in a circuit configuration as shown in FIG. 2. More specifically, a signal is supplied from a signal input circuit 10 including a signal source 11 and having an output impedance whose resistive component is denoted by R1 to an input transducer of a surface acoustic wave device SAW. An output transducer of the surface acoustic wave device SAW is connected to a load 21 of a signal output circuit 20 having an input impedance whose resistive component is denoted by R2. Referring to FIG. 2, inductances L1 and L2 are well known tuning coils.

Component characteristics in such a circuit configuration as shown in FIG. 2 must be such that the amplitude frequency characteristic of the circuit is good, the group delay time characteristic is good, the insertion loss is small and so on. A ripple in the pass band in the above described amplitude frequency characteristic and group delay time characteristic is susceptible to an electric triple transit echo (which may be referred to for brevity as TTE) of the surface acoustic wave device SAW. The electric triple transit echo and insertion loss are determined by the relation between the equivalent resistance component of the input transducer or output transducer of the surface wave filter SAW and the resistance component R1 or R2 of the signal input circuit 10 or the signal output circuit 20. Thus, in order to decrease the electric triple transit echo and to improve a ripple in the pass band, it is important that the resistance component proper of a transducer be made large as compared with the output impedance (resistance) or the input impedance (resistance) of an external circuit. To that end, one might think of relatively increasing the resistance component proper of a transducer or of relatively decreasing the resistance component of the external circuit. Employment of a transformer is known as the approach to decrease an electric triple transit echo based on the idea of relatively decreasing a resistance component of an external circuit. However, employment of such transformer involves a problem that a transformer per se is expensive and nevertheless bulky, and is therefore unsuited for an electric circuit employing a surface acoustic wave device developed for uses requiring a high degree of miniaturization. Furthermore, employment of a transformer decreases the freedom in circuit designing.

On the other hand, in order to increase the resistance component proper of a transducer, it is known to make short the overlapping length of the adjacent electrode fingers 2a, 2b and 3a, 3b, as shown in FIG. 1, to decrease the number of paired electrodes, and so on. However, reduction of the overlapping length of the adjacent electrode fingers causes deflection or divergence of a surface wave excited by the input transducer 2, for example, whereby it could happen that a portion of the surface wave is not received by the output transducer 3, thereby increasing the deflection loss. On the other hand, reduction of the number of paired electrodes makes it difficult to achieve a complicated freqeuency characteristic. Accordingly, such reduction of the overlapping length of the adjacent electrode fingers and reduction of the number of paired electrodes still involve problems to be solved and these can not be used as an expedient for effectively improving the electric triple transit echo.

One might think of reduction of the output impedance and the input impedance of the external circuit, i.e. the resistance value of the resistance R1 or R2 shown in FIG. 2. However, in general the impedance of such external circuit (the resistance R1 or R2) is primarily determined by the gain required by the whole circuit configuration and it is impossible to properly select such value individually in combination with a surface acoustic wave device SAW. As a result, the freedom in circuit designing of an electric circuit as a whole, including the external circuit, is degraded.

SUMMARY OF THE INVENTION

In general, a surface acoustic wave device comprises at least an input transducer and an output transducer, wherein each transducer is equivalent to a parallel circuit of a resistance component and a capacitance component. In accordance with the present invention, a capacitor is inserted in series between a signal input circuit and the input transducer and/or between a signal output circuit and the output transducer.

Provision of such a capacitor or capacitors causes an apparent increase of the resistive component of the transducer represented in terms of an equivalent circuit, whereby the electric triple transit echo is effectively reduced. According to the present invention, a circuit configuration is simplified and uses simple circuit components. Accordingly, an electric circuit using a surface acoustic wave having a reduced electric triple transit echo is provided at a lower cost.

In a preferred embodiment of the present invention, a differential amplifier is employed as a signal output circuit, in which case two capacitors of substantially the same value are inserted between the output transducer and two inputs of the differential amplifier. As a result, the magnitudes of the direct breakthrough signals at the two inputs of the differential amplifier are balanced, whereby ripple caused by the direct breakthrough signals is reduced.

Accordingly, a principal object of the present invention is to provide an improved surface acoustic wave device.

Another object of the present invention is to provide a circuit configuration that is capable of effectively reducing the electric triple transit echo of a surface acoustic wave device.

A further object of the present invention is to provide a circuit configuration that is capable of effectively reducing the electric triple transit echo of a surface acoustic wave device without exerting an influence upon other characteristics thereof.

Still a further object of the present invention is to provide a circuit configuration employing a surface acoustic wave device, wherein the freedom of circuit designing is enhanced and the electric transit echo is improved.

These objects and other objects, features, aspects and advantages of the present invention will become more apparent from the following detailed description when taken in conjunction with the accompanying drawings.

DESCRIPTION OF THE PREFERRED EMBODIMENTS

Figure 3A:
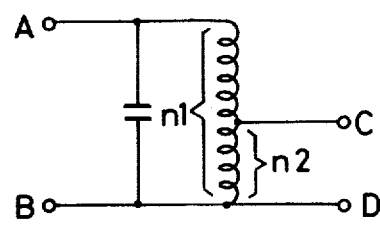
FIGS. 3A and 3B are schematic diagrams for explaining the principle of the present invention.

FIG. 3A is a schematic diagram of an impedance converting circuit of a well-known transformer type. Referring to FIG. 3A, the transformation ratio (turn ratio) between the terminals A and B and C and D is $n1:n2$ and the impedance conversion ratio is $n1^2:n2^2$.

Figure 3B:
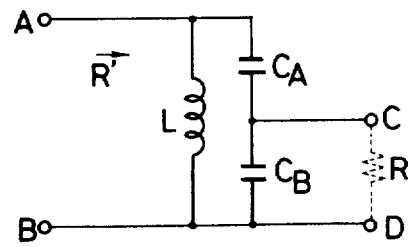

The inventors of the present application successfully implemented a novel circuit as shown in FIG. 3B which functions as an impedance converting circuit equivalent to the FIG. 3A diagram. Referring to FIG. 3B, the transformation ratio between the terminals A and B and C and D is expressed as $(C_A+C_B):C_A$ and the impedance conversion ratio is expressed as $(C_A+C_B)^2:C_A^2$. In the case where a resistor R having a resistance value R is connected between the terminals C and D, the impedance between the terminals A and B as viewed from the side of the resistor R becomes R'. The relation between R' and R may be expressed by the following equation (1).

$$R':R = (C_A+C_B)^2 : C_A^2 \qquad \text{(Equation 1)}$$

Accordingly, R' may be expressed by the following equation (2).

$$R' = \frac{(C_A+C_B)^2}{C_A^2} \cdot R = \left(1 + \frac{C_B}{C_A}\right)^2 \cdot R \qquad \text{(Equation 2)}$$

Referring to the above described equation (2), the relation $$\left(1 + \frac{C_B}{C_A}\right)^2 > 1$$

is always met, and therefore the relation $R' > R$ is always met. The present invention is based on an application of this novel impedance conversion principle to an electric circuit using a surface acoustic wave.

Figure 1:
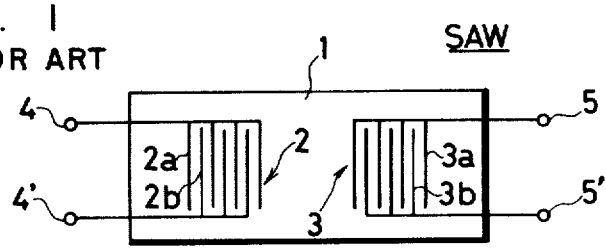
FIG. 1 is a view showing one example of a surface acoustic wave device, in which the present invention can be advantageously employed.
Figure 2:
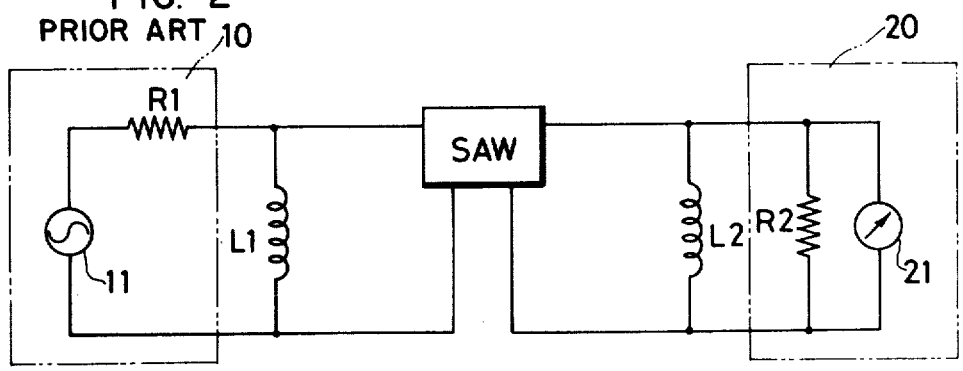
FIG. 2 is a view showing one example of a conventional circuit configuration employing a surface acoustic wave device.
Figure 4:
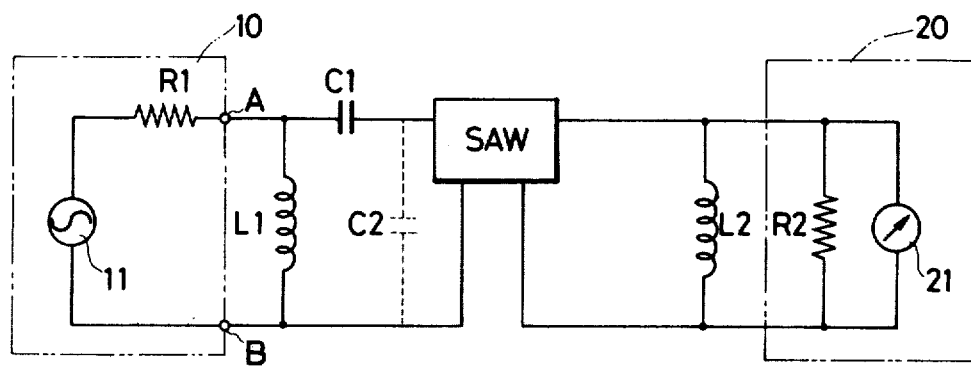
FIG. 4 is a schematic diagram showing one embodiment of the present invention.

FIG. 4 is a schematic diagram showing one embodiment of the present invention. In the embodiment shown a capacitor C1 is coupled in series between the input circuit 10 and the input transducer 2 (see FIG. 1) of the surface acoustic wave device SAW. An inductance or coil L1 is coupled through the above described capacitor C1 in parallel with the input transducer 2. A coil L2 is coupled in parallel with an output transducer (see FIG. 1). Referring to FIG. 3, an input circuit 10 and an output circuit 20 each comprise impedances R1 and R2, respectively.

Figure 5:
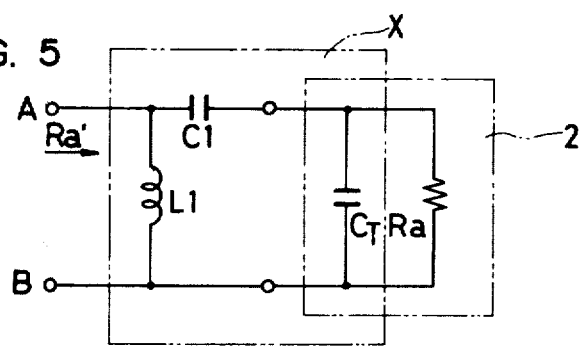
FIG. 5 is a diagram showing an equivalent circuit of the FIG. 4 embodiment.

FIG. 5 is a schematic diagram showing an equivalent circuit of an input side of a surface acoustic wave in accordance with the FIG. 4 embodiment. In FIG. 5, the input transducer 2 comprises a parallel connection of a capacitance $C_T$ and a resistance Ra. Referring to FIG. 5, the capacitance $C_T$ corresponds to the capacitance $C_B$ of the above described FIG. 3B diagram and the capacitance C1 corresponds to the capacitance $C_A$ and the coil L1 corresponds to the coil L2. These capacitances $C_T$ and C1 and the coil L constitute an impedance converting circuit X for use in the present invention. Accordingly, referring to FIG. 5, the resistance R' as viewed from the terminals A and B to the input transducer 2 may be expressed by the following equation (3) based on the above described equation (2).

$$Ra' = \left(1 + \frac{C_T}{C1}\right)^2 \cdot Ra \qquad \text{(Equation 3)}$$

Accordingly, by properly selecting the value of the capacitor C1 being added, it is possible to make Ra' be a value larger than Ra, without regard to the value of the inherent resistance Ra of the input transducer 2. More specifically, by the simple expedient of inserting only a capacitance C1, the apparent resistance Ra' of the input transducer 2 can be increased to be larger than the inherent resistance and accordingly the electric triple transit echo of the circuit can be effectively decreased. Meanwhile, preferably the value of the capacitance C1 should be selected such that Ra' may be a value within a given range, so that the insertion loss as well as the electric triple transit echo may be optimized.

The coil L1 functions not only as a component constituting an impedance converting circuit but also as a tuning coil. More specifically, parallel resonance is achieved by the coil L1 and the capacitances $C_T$ and C1. Accordingly, the inductance value of the coil L1 is selected in consideration of the values of the capacitances $C_T$ and C1. As a result of experimentation, it has been observed that the capacitance value of the capacitor C1 may be preferably in the range of 0.2 $C_T$ to 10 $C_T$. The capacitance value of the capacitor C1 being smaller than 0.2 $C_T$ causes too much mismatching between the input circuit 10 and the input transducer 2 and insertion loss becomes a problem from the practical standpoint. On the other hand, as the capacitance value of the capacitor C1 exceeds 10 $C_T$, the value of the resistance Ra' does not increase too much, so that the electric triple transit echo can not be decreased to the desired extent.

Meanwhile, referring to FIG. 4, the capacitor C2 shown by the dotted line is to correct an apparent capacitance variation of the input transducer of the surface acoustic wave device SAW by virtue of insertion of the capacitor C1 and is inserted between the input transducer 2 and the capacitor C1 and in parallel with the input transducer 2. Since the capacitor C2 is inserted for the purpose of capacitance correction, insertion of the capacitance C2 is not necessarily material to the present invention. At the same time the capacitor C2 serves to effectively increase the capacitance value in the case where the capacitance value $C_T$ of the transducer proper is small.

Figure 6:
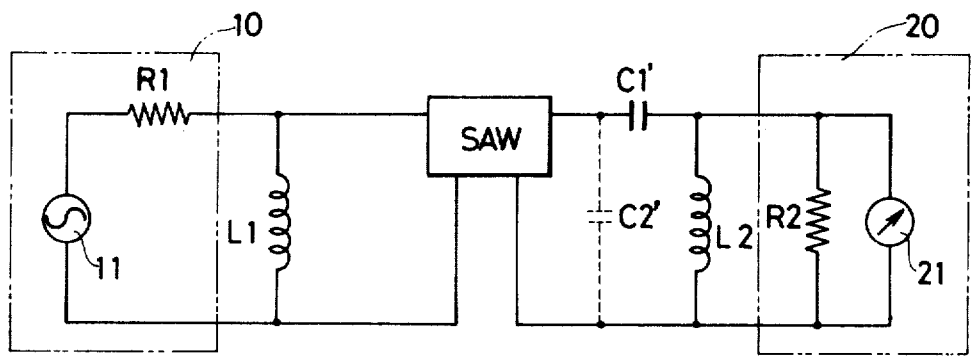
FIG. 6 is a schematic diagram of another embodiment of the present invention.

FIG. 6 is a schematic diagram showing another embodiment of the present invention. The FIG. 6 embodiment comprises a capacitor C1' and a coil L2 inserted at the output side of the surface acoustic wave device SAW, while the FIG. 4 embodiment comprises the capacitor C1 inserted at the input side of the surface acoustic wave device SAW. Since the operation, the effect and advantage achieved by the FIG. 6 embodiment are substantially the same as those achieved by the FIG. 4 embodiment, a more detailed description will be omitted.

A capacitor being inserted in series with the surface acoustic wave device SAW in accordance with the present invention may be inserted at both the input and output sides of the surface acoustic wave device SAW.

As a result of experimentation, the following result was obtained. In the experimentation, the impedances of the input and output transducers 2 and 3 of the surface acoustic wave device SAW are 2 KΩ(Ra)//8 pF ($C_T$) and 2 KΩ//8 pF, respectively, at the central frequency (58 MHz), wherein the surface acoustic wave device SAW is used as a filter and the resistance R1 is 330Ω and the resistance R2 is 680Ω. In such a case, without the capacitors C1 and C1' inserted, the insertion loss was 12.5 dB and the electric triple transit echo was −35 dB. By contrast, in the case where the capacitors C1 and/or C1' are inserted as done in the above described embodiment and the capacitance value is selected to be 8 pF, then the insertion loss was 15 dB and the electric triple transit echo was −40 dB. As is clear from the experimentation result, according to the embodiment shown, the insertion loss has increased by 2.5 dB but the electric triple transit echo was made to be as small as −40 dB.

Figure 7:
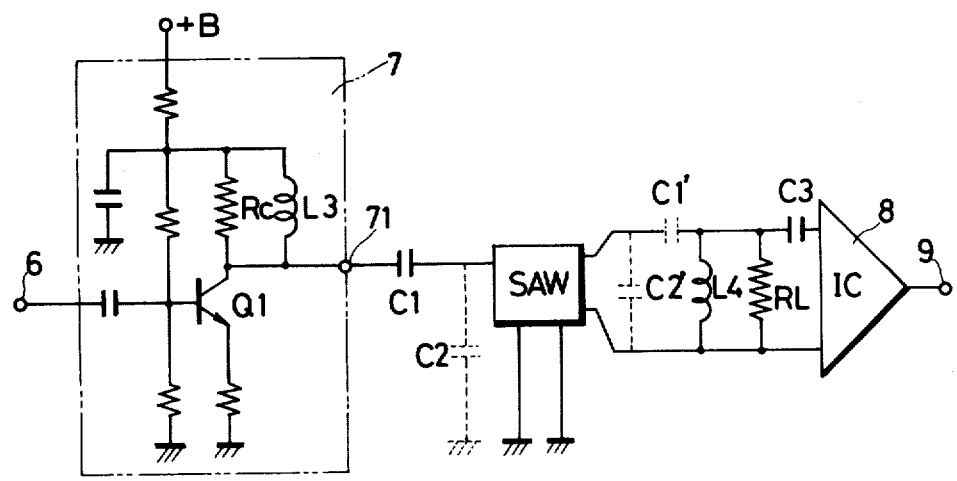
FIG. 7 is a schematic diagram of a video intermediate frequency circuit of a television receiver employing a preferred embodiment of the present invention.

FIG. 7 is a schematic diagram of a video intermediate frequency amplifier of a television receiver employing a preferred embodiment of the present invention. Referring to FIG. 7, a video intermediate frequency signal supplied from a tuner, not shown, to an input terminal 6 is amplified by a preamplifier or minor signal amplifier 7 and is then applied to a surface acoustic wave device SAW. The output terminal 71 of preamplifier 7 is coupled through a capacitor C1 in accordance with the present invention to an input transducer of the surface acoustic wave device SAW. A coil L3 is provided as an impedance converting and tuning coil and corresponds to the inductance L1 shown in FIG. 4. A tuning coil L4 corresponding to the inductance L2 shown in FIG. 4 is coupled in parallel with an output transducer of the surface acoustic wave device SAW and is also coupled through a coupling capacitor C3 of for example 1000 pF to an integrated circuit 8. The integrated circuit 8 may comprise a video amplifier, a detector and the like. Accordingly, a video signal is obtained from the output terminal 9. Referring to FIG. 7, the resistance corresponding to the resistance R1 of the FIG. 4 embodiment is represented as a parallel connection of the resistive component of the output impedance of a transistor Q1 and the resistor Rc. The resistance corresponding to the resistance R2 of the FIG. 4 embodiment is represented as a parallel connection of the resistive component of the input impedance of the integrated circuit 8 and the resistor RL.

In the FIG. 7 embodiment the capacitors C2' and C1' may be included as shown by the dotted line.

Figure 8:
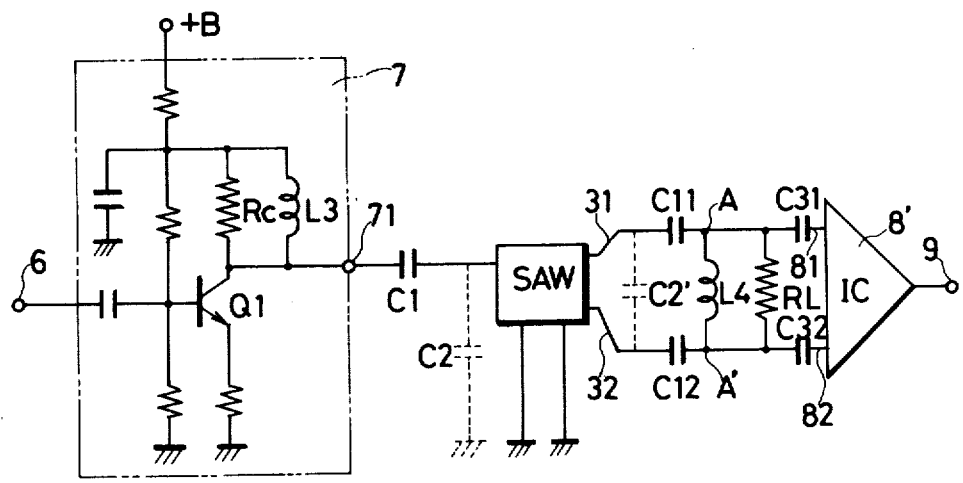
FIG. 8 is a schematic diagram of another example of a video intermediate frequency circuit of a television receiver employing another preferred embodiment of the present invention.

FIG. 8 is a schematic diagram of another example of a video intermediate frequency amplifier of a television receiver employing a preferred embodiment of the present invention. The embodiment shown is substantially the same as the FIG. 7 embodiment, except for the following respects. More specifically, the integrated circuit 8' comprises an amplifier which is a differential amplifier. The differential amplifier comprises two input terminals 81 and 82.

The output terminals (the terminals of the output transducer) 31 and 32 of a surface acoustic wave device SAW are coupled through the above described capacitors C11 and C12, to which they are respectively coupled in series and between which a coil L4 is connected to the input terminals 81 and 82, respectively, of the differential amplifier. The capacitors C11 and C12 are selected to be of substantially the same capacitance value.

Figure 8A:
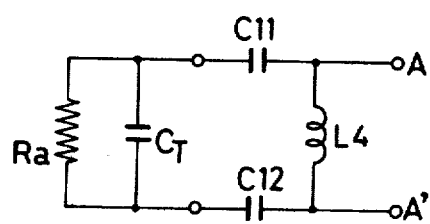
FIG. 8A is an equivalent circuit of the FIG. 7 diagram.

An equivalent circuit of the output side of the surface acoustic wave device SAW of the embodiment shown is illustrated in FIG. 8A. Referring to FIG. 8A, the output transducer of the surface acoustic wave device SAW may also be represented as a parallel connection of a capacitance $C_T$ and a resistance Ra, as in the case of the input transducer 2 as described previously and therefore in the case of the embodiment shown the capacitors C11 and C12 each coupled in series with the parallel circuit. Referring to FIG. 8A, the resistance Ra' as viewed from the terminals A and A' becomes larger than the inherent resistance Ra of the output transducer 3, as is apparent from the description given above in conjunction with FIG. 3B. Accordingly, the electric triple transit echo of the surface acoustic wave device SAW is decreased, as described previously. However, in the case of the embodiment shown in FIG. 8, the insertion loss is more or less increased in accordance with an increase of the impedance (resistance). Accordingly, it is necessary to select the capacitance values of the capacitors C11 and C12 being inserted in series between the surface acoustic wave devices SAW and the integrated circuit (the differential amplifier 8') to be of such values as not to affect the insertion loss substantially. As a result of experimentation, it has been observed that the capacitance values of the capacitors C11 and C12 are preferably selected in the range of 0.4 $C_T$ to 20 $C_T$. The reason may be the same as described in conjunction with the FIG. 4 embodiment.

The experimentation brought about the following result. More specifically, in the case where the impedances of the input and output transducers of the surface acoustic wave device SAW are 2 KΩ//8 pF and 2 KΩ(Ra)//8 pF($C_T$), respectively, and the resistances R1 and R2 are 330Ω and 680Ω, respectively, then without the capacitors C1, C11 and C12 being inserted, the insertion loss was 12.5 dB and the electric triple transit echo was −35 dB. By contrast, when the capacitors C1, C11 and C12 are inserted as in the embodiment shown, in which the capacitance values are 15 pF, while the inductance value of the coil L4 is changed to compensate for the insertion of the capacitors C11 and C12, the insertion loss was approximately 15 dB and the electric triple transit echo was approximately −40 dB. As is clear from the result thus obtained, according to the embodiment shown, although the insertion loss increases by approximately 2.5 dB, the electric triple transit echo becomes as small as approximately −40 dB. In FIG. 8, the resistance corresponding to resistance R1 of FIG. 4 is a parallel resistance comprising the resistive component of the output impedance of a transistor Q1 and a resistor Rc, and the resistance corresponding to resistance R2 of FIG. 4 is a parallel resistance comprising the resistive component of the input impedance of the differential amplifier 8' and a resistor RL.

Figure 9:
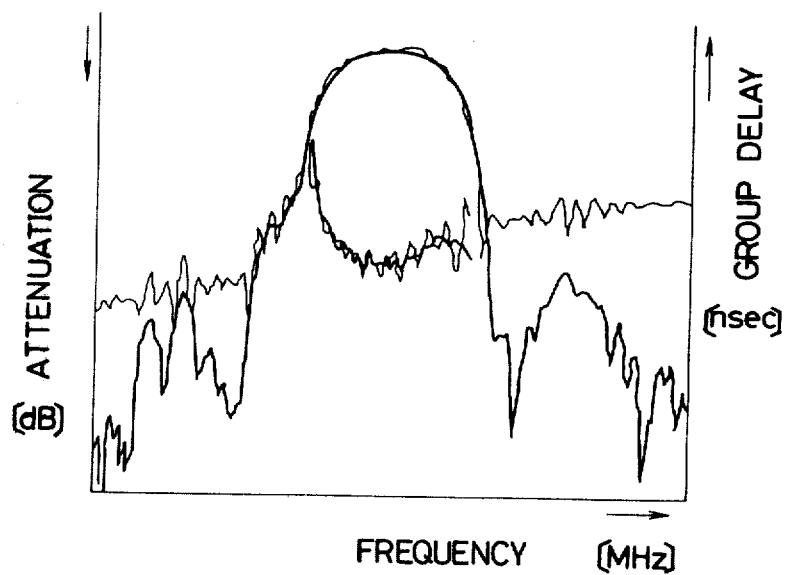
FIG. 9 is a graph for explaining the effect of the FIG. 7 embodiment, wherein the ordinate indicates the attenuation and group delay and the abscissa indicates the frequency.

In further experimentation, the frequency characteristic was measured both in the case where only the capacitor C11 is inserted without the capacitor C12 being inserted and the capacitance value was selected to be 8 pF, and in case where both the capacitors C11 and C12 of 15 pF are inserted, as in the case of the embodiment shown. The experimentation was to compare the frequency characteristics of the attenuation and group delay with respect to the output signal from the differential amplifier 8'. The result is shown in FIG. 9. Referring to FIG. 9, the light curve shows the result in the case in which only the capacitor C11 was included, while the heavier curve shows the result in the case of both capacitors C11 and C12 being inserted. As is clear from FIG. 9, the latter (the FIG. 8 embodiment) is large as compared with the former in attenuation of the side lobe with respect to the attenuation characteristic and also has relatively litte ripple of a pass band. Improvement is also seen with respect to the group delay when both capacitors C11 and C12 are included. The reason is presumably that since the capacitors C11 and C12 of have substantially the same capacitance value and are inserted in a symmetrical manner in the embodiment shown, the stray capacitances caused between the terminal 71 and the terminals A and A' become substantially the same and as a result the direct breakthrough signals transmitted through the stray capacitances also become substantially the same and are offset by the differential amplifier 8'.

Although the embodiment of FIG. 8 was described as embodied in a video intermediate frequency stage, the present invention can be applied to any other circuits, and is not limited to a VIF stage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electric circuit including a surface acoustic wave device, comprising:
   a surface acoustic wave device including an input transducer and an output transducer formed on a piezoelectric substrate, each of said transducers having a respective pair of terminals, and the impedance of each of said transducers as measured across said respective pair of terminals having a respective resistive component and a respective capacitive component; and
   impedance conversion circuit means, including first capacitor means having one end connected to one terminal of one of said pairs of terminals and inductor means having one end connected to a second end of said first capacitor means and having a second end connected to the other terminal of said one of said pairs of terminals, the value of said first capacitor means being such that the impedance measured across said ends of said inductor means has a larger resistive component than said resistive component of said transducer impedance measured across said one of said pairs of terminals.

2. An electric circuit in accordance with claim 1, wherein the value of said capacitor means is from 0.2 to 10 times said capacitive component of said transducer impedance measured across said one of said pairs of terminals.

3. An electric circuit in accordance with claim 1, wherein said one of said pairs of terminals is said pair of terminals of said output transducer.

4. An electric circuit in accordance with claim 3, further comprising a differential amplifier having two inputs coupled to respective ones of said ends of said inductor means, and wherein said impedance conversion circuit means further comprises second capacitor means connected between said second end of said inductor means and said other terminal of said output transducer, said first and second capacitor means having substantially equal values.

5. An electric circuit in accordance with claim 4, wherein the value of each of said capacitor means is from 0.4 to 20 times said capacitive component of said impedance of said output transducer.

6. An electric circuit in accordance with claim 1, wherein said one of said pairs of terminals is said pair of terminals of said input transducer.

7. An electric circuit in accordance with claim 3, claim 4 or claim 6, wherein said impedance conversion circuit means further includes additional capacitor means connected across said one of said pairs of terminals.

* * * * *